(12) United States Patent
Holmes et al.

(10) Patent No.: US 11,302,857 B2
(45) Date of Patent: Apr. 12, 2022

(54) CRYOGENIC REFRIGERATION FOR LOW TEMPERATURE DEVICES

(71) Applicant: International Business Machines Corporation, Armonk, NY (US)

(72) Inventors: Steven J. Holmes, Ossining, NY (US); Devendra K. Sadana, Pleasantville, NY (US); Stephen W. Bedell, Wappingers Falls, NY (US); Ning Li, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 16/687,725

(22) Filed: Nov. 19, 2019

(65) Prior Publication Data
US 2021/0151658 A1    May 20, 2021

(51) Int. Cl.
| | | |
|---|---|---|
| *H01L 39/24* | (2006.01) | |
| *H01L 39/12* | (2006.01) | |
| *F25B 21/00* | (2006.01) | |
| *H01L 27/18* | (2006.01) | |
| *H01L 39/22* | (2006.01) | |
| *G06N 10/00* | (2022.01) | |

(52) U.S. Cl.
CPC .......... *H01L 39/2406* (2013.01); *F25B 21/00* (2013.01); *H01L 27/18* (2013.01); *H01L 39/12* (2013.01); *H01L 39/22* (2013.01); *H01L 39/24* (2013.01); *G06N 10/00* (2019.01); *Y02B 30/00* (2013.01)

(58) Field of Classification Search
CPC ......... H01L 29/18; H01L 24/81; H01L 24/13; H01L 39/2467; H01L 39/025; H01L 39/2493; H01L 39/2406; H01L 39/12; F25B 21/00; G06N 10/00
See application file for complete search history.

(56) References Cited

U.S. PATENT DOCUMENTS

| | | | |
|---|---|---|---|
| 3,643,237 A | 2/1972 | Anacker | |
| 5,281,447 A * | 1/1994 | Brady | .................. G03F 7/0047 427/555 |

(Continued)

FOREIGN PATENT DOCUMENTS

| | | |
|---|---|---|
| JP | 04174261 A | 6/1992 |
| WO | 9720972 A1 | 6/1997 |

(Continued)

OTHER PUBLICATIONS

Giazotto, et al., "Opportunities for mesoscopics in thermometry and refrigeration: Physics and applications," Reviews of Modern Physics, vol. 78, Jan. 2006, 58 pages, © 2006 The American Physical Society.

(Continued)

*Primary Examiner* — Ermias T Woldegeorgis
(74) *Attorney, Agent, or Firm* — Mark Bergner

(57) ABSTRACT

A method for fabricating an active cooling structure, comprising forming an array of Superconductor-Insulator-Normal Metal (NIS) tunnel structures between a non-conducting layer and a superconducting layer. The non-superconducting layer may comprise a plurality of non-superconducting traces running in a first direction. The superconductor layer may comprise a plurality of superconducting traces running in a second direction.

20 Claims, 9 Drawing Sheets

(56) References Cited

U.S. PATENT DOCUMENTS

| | | | |
|---|---|---|---|
| 5,376,755 A * | 12/1994 | Negm | H01B 12/02 |
| | | | 505/231 |
| 5,834,828 A | 11/1998 | Horn et al. | |
| 5,867,990 A | 2/1999 | Ghoshal | |
| 6,463,743 B1 | 10/2002 | Laliberte | |
| 6,494,048 B1 | 12/2002 | Ghoshal et al. | |
| 6,581,387 B1 | 6/2003 | Ullom | |
| 9,619,860 B2 | 4/2017 | Dong et al. | |
| 9,696,065 B2 | 7/2017 | Lonzarich et al. | |
| 2006/0254286 A1 | 11/2006 | Johnson et al. | |
| 2011/0163455 A1 | 7/2011 | Gaidis | |
| 2014/0150465 A1 | 6/2014 | Boarman et al. | |
| 2014/0315723 A1 * | 10/2014 | Moyerman | H01L 39/228 |
| | | | 505/160 |
| 2018/0292119 A1 | 10/2018 | Sung | |
| 2021/0063060 A1 | 3/2021 | Young | |
| 2021/0066571 A1 * | 3/2021 | Hathaway | H01L 39/2493 |

FOREIGN PATENT DOCUMENTS

| | | |
|---|---|---|
| WO | 9966567 W | 12/1999 |
| WO | 2017115008 A1 | 7/2017 |
| WO | 2018208680 A1 | 11/2018 |

OTHER PUBLICATIONS

Bruggemann, et al., "Cooling a Magnetic Nanoisland by Spin-Polarized Currents," Physical Review Letters, PRL 113, 076602 (2014), 5 pages, © 2014 American Physical Society.

Clark, et al., "Cooling of bulk material by electrontunneling refrigerators," Applied Physics Letters, Appl. Phys. Lett. 86, 173508 (2005); https://doi.org/10.1063/1.1914966, 4 pages, © 2005 American Institute of Physics.

Lowell, et al., "Sub-100 mK Cooling Using Normal-Metal\Insulator\Superconductor Tunnel Junctions," Springer, Dec. 15, 2013, J Low Temp Phys, DOI 10.1007/s10909-013-1009-0, 7 pages.

Unknown, "Dry dilution refrigerator with 4He-1K-loop.," Abstract, Printed Sep. 10, 2019, 16 pages.

Batey, et al., "Principles of dilution refiigeration," A Brief Technology Guide, Oxford Instruments, 2015, 20 pages, © Oxford Instruments Nanotechnology Tools Limited, 2015.

Rubin et al., "Through-Silicon-Via Fabrication in Planar Quantum Devices," U.S. Appl. No. 16/396,992, filed Apr. 29, 2019.

Torgovkin et al., "Normal-Metal-lnsulator-Superconductor Tunnel Junction With Atomic-Layer-Deposited Titanium Nitride as Superconductor," Abstract Only, IEEE, IEEE Transactions on Applied Superconductivity, vol. 25, Issue 3, Jun. 2015, 2 pages, DOI: 10.1109/TASC.2014.2383914.

Räisänen et al., "Normal metal—insulator—superconductor thermometers and coolers with titanium-gold bilayer as the normal metal," 28th International Conference on Low Temperature Physics (LT28), IOP Conf. Series: Journal of Physics: Conf. Series 969, 2018, 7 pages.

Mastomäki, "Superconducting tunnel junctions and nanorefrigeration using InAs nanowires," Master's Thesis, Jun. 14, 2017, 78 pages.

Jituri, "Refrigeration With And Of Solid State Devices," Delft University of Technology, Netherlands, Aug. 14, 2009, 151 pages.

Holmes et al., "Cryogenic Refrigeration for Low Temperature Devices," U.S. Appl. No. 16/687,725, filed Nov. 19, 2019.

List of IBM Patents or Patent Applications Treated as Related, dated Nov. 19, 2019, 2 pages.

Leoni R. et al, "Electron cooling by arrays of submicron tunnel junctions", Journal of Applied Physics, American Institute of Physics, US vol. 85, No. 7, Apr. 1, 1999, pp. 3877-3881.

Leoni Roberto et al: "Electron cooling by small tunel junctions for a self-refrigerating bolometer", Physica B: Condensed Matter, vol. 284-288, Jul. 1, 2000, pp. 2039-2040, XP055772731, Amsterdam, NL.

PCT International Search Report and Written Opinion, PCT International Application No. PCT/EP2020/082680, dated Feb. 18, 2021.

* cited by examiner

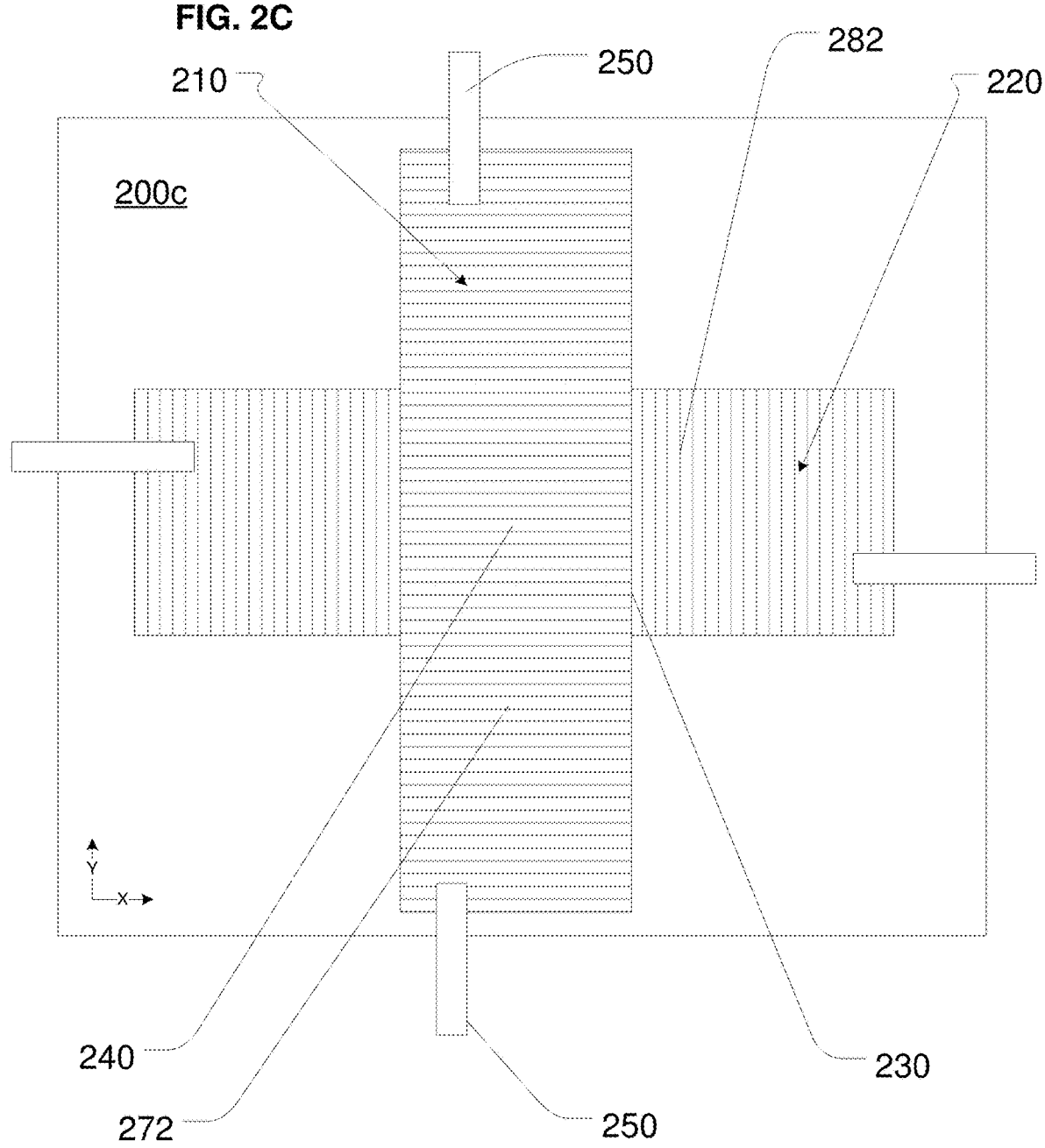

CRYOGENIC REFRIGERATION FOR LOW TEMPERATURE DEVICES

TECHNICAL FIELD

Disclosed herein is a cooling apparatus and fabrication method for low temperature electronic devices, and, more particularly, active cooling for low temperature and extremely low temperature superconducting devices.

BACKGROUND

Molecules and subatomic particles follow the laws of quantum mechanics, a branch of physics that explores how the physical world works at a fundamental level. At this level, particles behave in strange ways, taking on more than one state at the same time, and interacting with other particles that are very far away. Quantum computing harnesses these quantum phenomena to process information.

Many quantum devices suitable for use in quantum computing require low or extremely low temperatures in order to function. If the temperature rises above those levels, errors are introduced to the quantum computing process. Traditional vapor compression coolers, however, are bulky, expensive, and not completely reliable to maintain the array of devices at those temperatures.

SUMMARY

According to one or more embodiments, a method for fabricating an active cooling structure, comprising forming an array of Superconductor-Insulator-Normal Metal (NIS) tunnel structures between a non-conducting layer and a superconducting layer. The non-superconducting layer may comprise a plurality of non-superconducting traces running in a first direction. The superconductor layer may comprise a plurality of superconducting traces running in a second direction.

According to one or more embodiments, a fabrication method for a quantum processor, comprising forming a plurality of qubits formed on the first substrate, and forming an active cooling structure in thermal communication with the qubits. The active cooling structure may comprise a non-superconducting metal layer, an insulator layer formed on top of the non-superconducting layer, and a superconductor layer formed on top of the insulator layer.

According to one or more embodiments, a semiconductor fabrication system for fabricating a thermalization structure. The semiconductor fabrication system may comprise a computer readable storage media having a set of instructions for a fabrication facility encoded thereon which, when operated by a processor, causes a fabrication method to be performed. The fabrication method may comprise forming an array of Superconductor-Insulator-Normal Metal (NIS) tunnel structures between a non-conducting layer and a superconducting layer. The non-superconducting layer may comprise a plurality of non-superconducting traces running in a first direction and the superconductor layer may comprise a plurality of superconducting traces running in a second direction.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 2C illustrates another example active planar cooling structure consistent with some embodiments;

Figure 1:
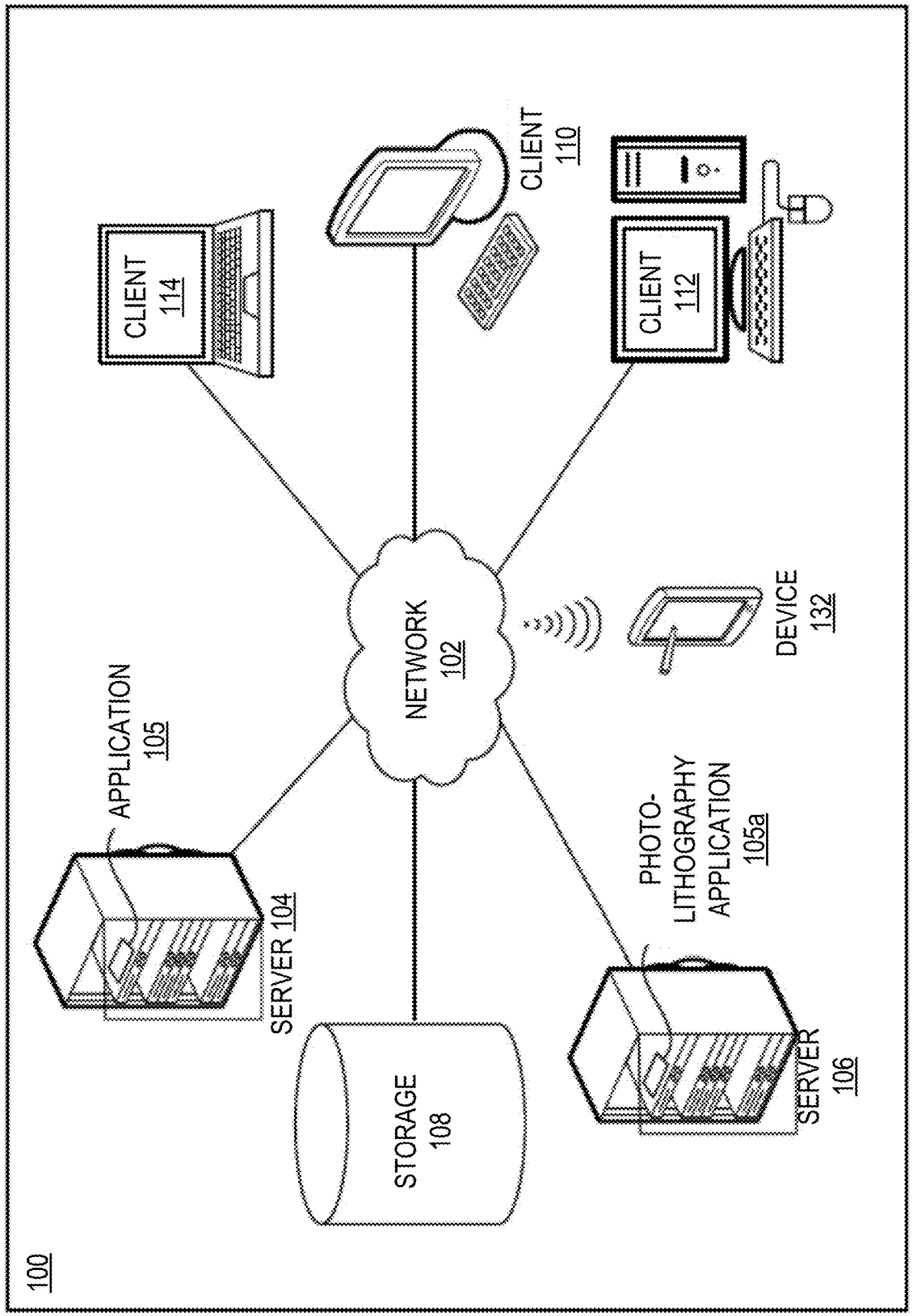
FIG. 1 depicts a block diagram of a network of data processing systems consistent with some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

A "low temperature" range, as used herein, refers to a cryogenic temperature range, which starts at or about 77 Kelvin (K). "Extreme low temperature" starts at or about 10 Kelvin and extends down to at least 1 millikelvin (0.001 K), and in some cases as low as possible using available technology, currently around 0.000001 K.

A "low temperature device" (LTD) is a device operating in a low or extreme low temperature range. Most LTDs operating at low or extreme temperatures rely on materials that exhibit superconducting properties at those temperatures.

Overview

Aspects of the present disclosure relate to a cooling apparatus and fabrication method for low temperature electronic devices, more particular aspects relate to active cooling for low temperature and extremely low temperature superconducting devices. While the present disclosure is not necessarily limited to such applications, various aspects of the disclosure may be appreciated through a discussion of various examples using this context.

LTD devices, including superconducting devices, produce heat when operating. Heat removal in such cryogenic temperature ranges, however, poses unique challenges.

Some embodiments package active, solid state cooling devices near or in contact with the LTD devices in the cooling chamber of a dilution refrigerator to assist in maintaining the LTD devices at low or extremely low temperatures. Some embodiments may also allow for reduction in some of the other cooling structures and may improve overall reliability.

Quantum Computing

Most of the computers used today are known as classical computers. A classical computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1s and 0s. A quantum processor (q-processor), in contrast, uses the odd nature of entangled qubit devices (compactly referred to herein as "qubit," plural "qubits") to perform computational tasks. In the particular realm where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Classical computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers.

Superconducting qubits, in turn, generally use one or more layers of different materials to implement the device properties and function. A layer of material can be superconductive, conductive, semi-conductive, insulating, resistive, inductive, capacitive, or have any number of other properties. Different layers of materials may have to be formed using different methods, given the nature of the material, the shape, size or placement of the material, other materials adjacent to the material, and many other considerations.

Most quantum devices suitable for use as qubits in quantum computing require low or extremely low temperatures in order to function.

Data Processing Environment

FIG. 1 depicts a block diagram of a network of data processing environment in which illustrative embodiments may be implemented. The data processing environment 100 is a network of computers in which the illustrative embodiments may be implemented. The data processing environment 100 includes a network 102. The network 102 is the medium used to provide a communications links between the various devices and computers connected together within the data processing environment 100. The network 102 may include connections, such as wire, wireless communication links, or fiber optic cables.

The data processing environment 100 includes a plurality of clients 110, 112, 114, 132 and a plurality of servers 104, 106 that commutatively couple via the network 102 with a storage unit 108. The clients 110, 112, 114, servers 104, 106, and storage unit 108 depicted in FIG. 1 are devices described with only example roles of certain data processing systems connected to the network 102 and are not intended to exclude other configurations or roles for these data processing systems. Any of the components in the data processing environment 100, such as server 104 or 106, or client 110, 112, 114, or 132 may contain data and may have software applications and/or software tools 105 executing thereon.

Device 132 and client 114 are examples of client devices. For example, the devices 132 can take the form of a smartphone, a tablet computer, a laptop computer, a wearable computing device, appliance, or as any other suitable device. Software applications and/or tools 105 described as executing in another data processing system in FIG. 1 may, in some embodiments, be configured to execute in the device 132 in a similar manner. Data or information stored or produced in another data processing system in FIG. 1 may, in some embodiments, be configured to be stored or produced in the device 132 in a similar manner.

Photolithography application 105a may be used to implement or partially implement some embodiments described herein. In those embodiments, the photolithography application 105a is a software component of a system for fabricating an active planar cooling structure, a Josephson junction, a qubit, and/or other superconducting structures used in quantum computing devices. Photolithography application 105a provides instructions to such a fabrication system for causing the assembly of some novel cryogenic methods and systems contemplated in some embodiments described herein.

Cooling Structures

Figure 2A:
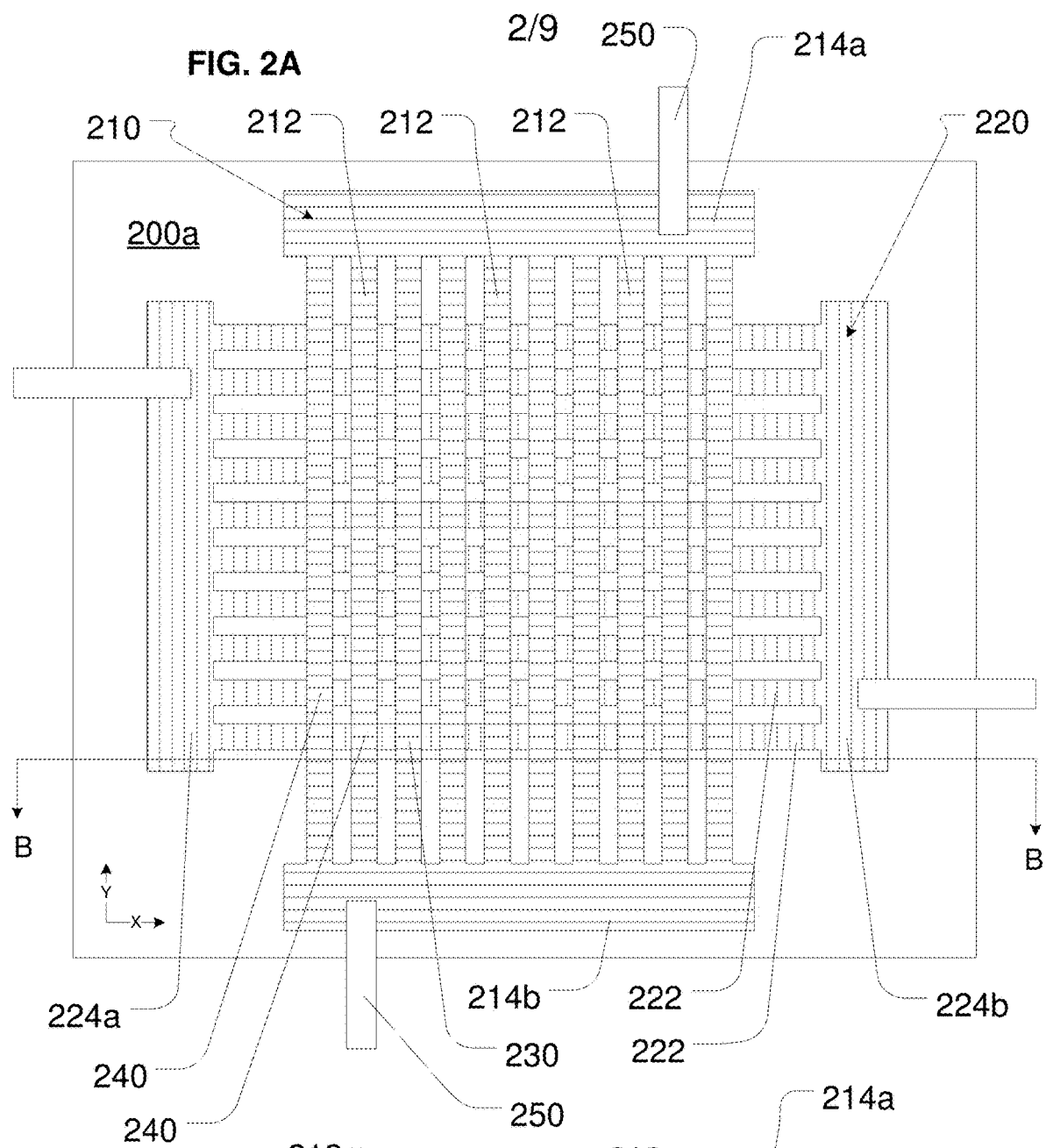
FIG. 2A illustrates a top view of an example active planar cooling structure consistent with some embodiments.
Figure 2B:
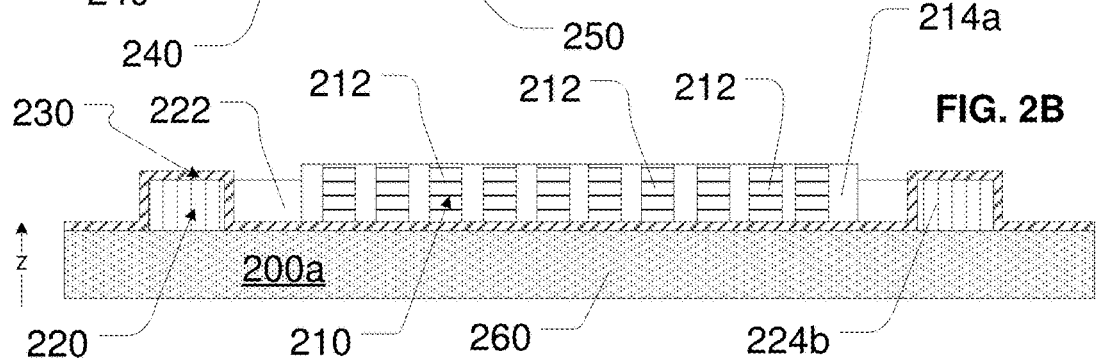
FIG. 2B illustrates the example cooling structure of FIG. 2A, sectioned along line BB.

FIG. 2A illustrates a top view of an example active planar cooling structure 200 consistent with some embodiments. FIG. 2B illustrates the example cooling structure 200 of FIG. 2A, sectioned along line B. The cooling structure 200 embodiment in FIGS. 2A and 2B comprises a superconductor layer 210 and a normal metal (i.e., non-superconducting) layer 220 separated by an insulator layer 230. The superconductor layer 210 in some embodiments is formed into a plurality of generally parallel superconductor traces 212 (only some labeled for clarity) running in a first direction (Y direction as depicted). The superconductor traces 202 may be electrically connected to common pads 214a and 214b. The normal metal layer 210 is similarly formed into a plurality of generally parallel normal metal traces 222 (only some labeled for clarity) running in a second direct, orthogonal to the first direction (X direction as depicted). The normal metal traces 222 are electrically connected to common pads 224a and 224b. In some embodiments, the superconductor layer 220 is formed first, on top of (i.e., adjacent to) a substrate 260, with the normal metal layer 210 later formed on top of (i.e., adjacent to) the insulator layer 230. In other embodiments, the normal metal layer 210 is formed first, on top of (i.e., adjacent to) the substrate 260, with the superconductor layer 220 later formed on top of (i.e., adjacent to) the insulator layer 230.

An array of Superconductor-Insulator-Normal Metal (NIS) tunnel structures 240 (only some labeled for clarity) are formed in a grid pattern at the intersections (in the X-Y plane) of the superconductor traces 212 and the normal metal traces 222. Example cooling structure 200 also comprises a plurality of electrical contacts 250 (only some labeled for clarity) and may be created on a surface of a substrate 260.

In some embodiments, when a small potential (bias voltage V) is applied between the superconductor layer 210 and the normal metal layer 220, the relatively higher energy ("hot") electrons can traverse the dielectric between the two layers. Relatively lower energy ("cold") electrons, in contrast, are unable to traverse the dielectric. Together, this has the effect of transferring heat energy away from a heat source, such as a quantum device or interface electronics.

In some embodiments, the normal metal layer may be any substance that is compatible with substrate 260 and with any manufacturing processes subsequently required to form the rest of the structure 200 (see FIGS. 7-8) and/or the cooled device (see FIGS. 3-6). In some embodiments and for some applications, it may also desirable that the normal metal layer to fail to act as a superconductor at the chosen low and/or extreme low operating temperatures, yet still be a good normal conductor to reduce heat added to the system via resistance, and that the normal metal layer be nonmagnetic to avoid interference with the qubits. Suitable normal metals include, but are not limited to, silver, gold, copper, platinum, and palladium.

The superconductor layer 210 in some embodiments may be any substance that exhibits superconducting properties at the chosen low and/or extremely low operating temperature, is compatible with the other chosen materials, and with any manufacturing processes used. Suitable superconducting materials for some embodiments and some applications include, but are not limited to, aluminum, niobium, tantalum, titanium, tantalum nitride, titanium nitride, vanadium, lead, tin, and gallium. The insulator layer 230 may be any substance that acts as a dielectric between the superconducting metal layer 210 and the normal layer 220 at the low and/or extremely low operating temperature, as well as being compatible with the other chosen materials and manufacturing processes. For some embodiments and some applications, suitable such substances include silicon dioxide ($SiO_2$), Hafnium dioxide ($HfO_2$), and aluminum oxide ($Al_2O_3$). Various nitrides may also be suitable for some embodiments and some applications, such as silicon nitride, hafnium nitride, aluminum nitride, and zirconium nitride.

FIG. 2C illustrates another example active planar cooling structure 200c consistent with some embodiments. The active planar cooling structure 200c in FIG. 2C also comprises a superconductor layer 210 and a normal metal (i.e., non-superconducting) layer 220 separated by an insulator layer 230. The superconductor layer 210 and normal metal layer 220 in FIG. 2C, however, each comprise a single flat plane 272, 282 of superconductor material or normal metal, respectively. As with the embodiment in FIGS. 2A-2B, a NIS tunnel structure 240 is formed where the two planes 272, 282 overlap. This active planar cooling structure embodiment 200c may be desirable for active cooling in space-constrained locations, such as the active planar cooling structure 303 in FIG. 3B.

Figure 3A:
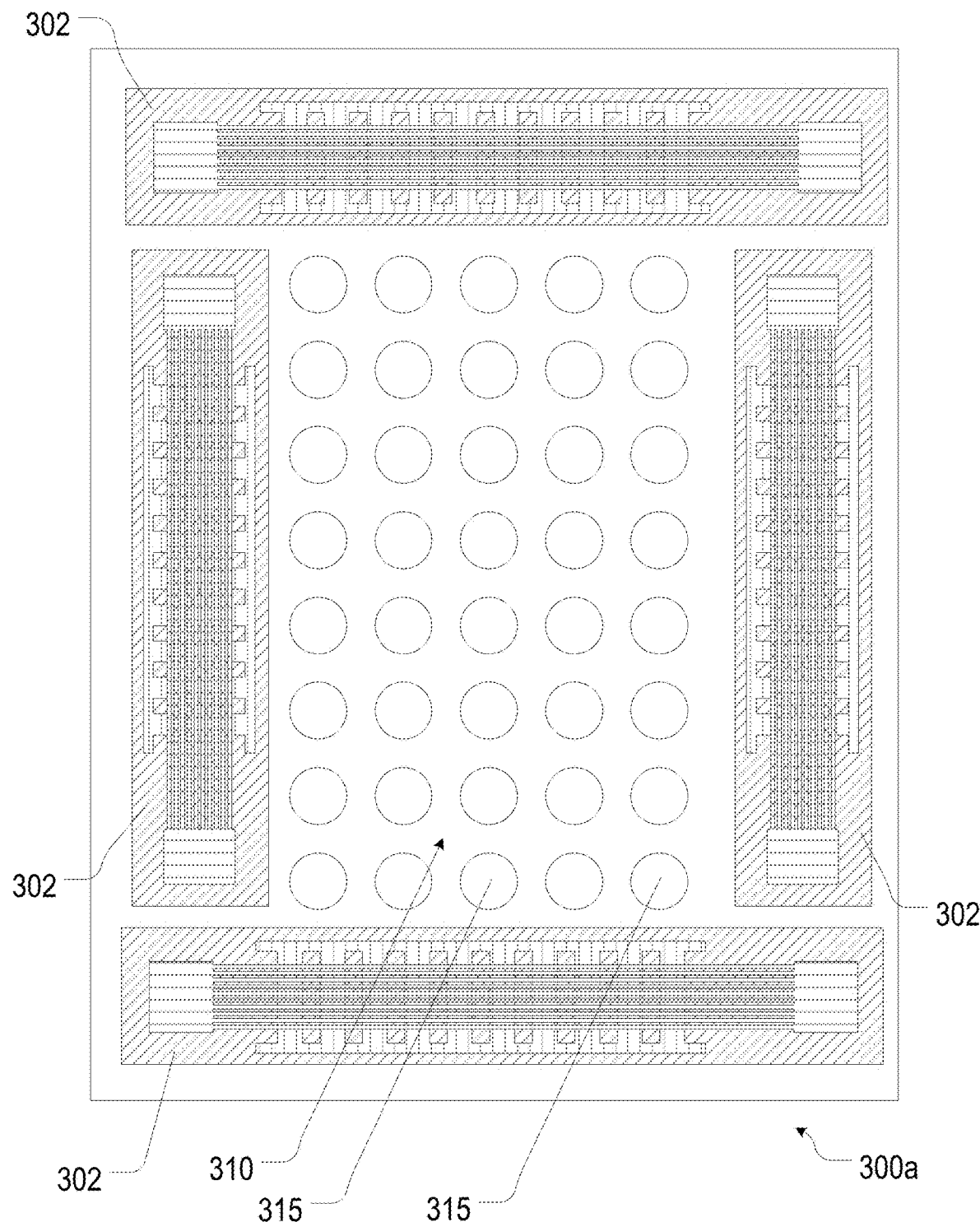
FIG. 3A illustrates an example actively cooled quantum processor, consistent with some embodiments.
Figure 3B:
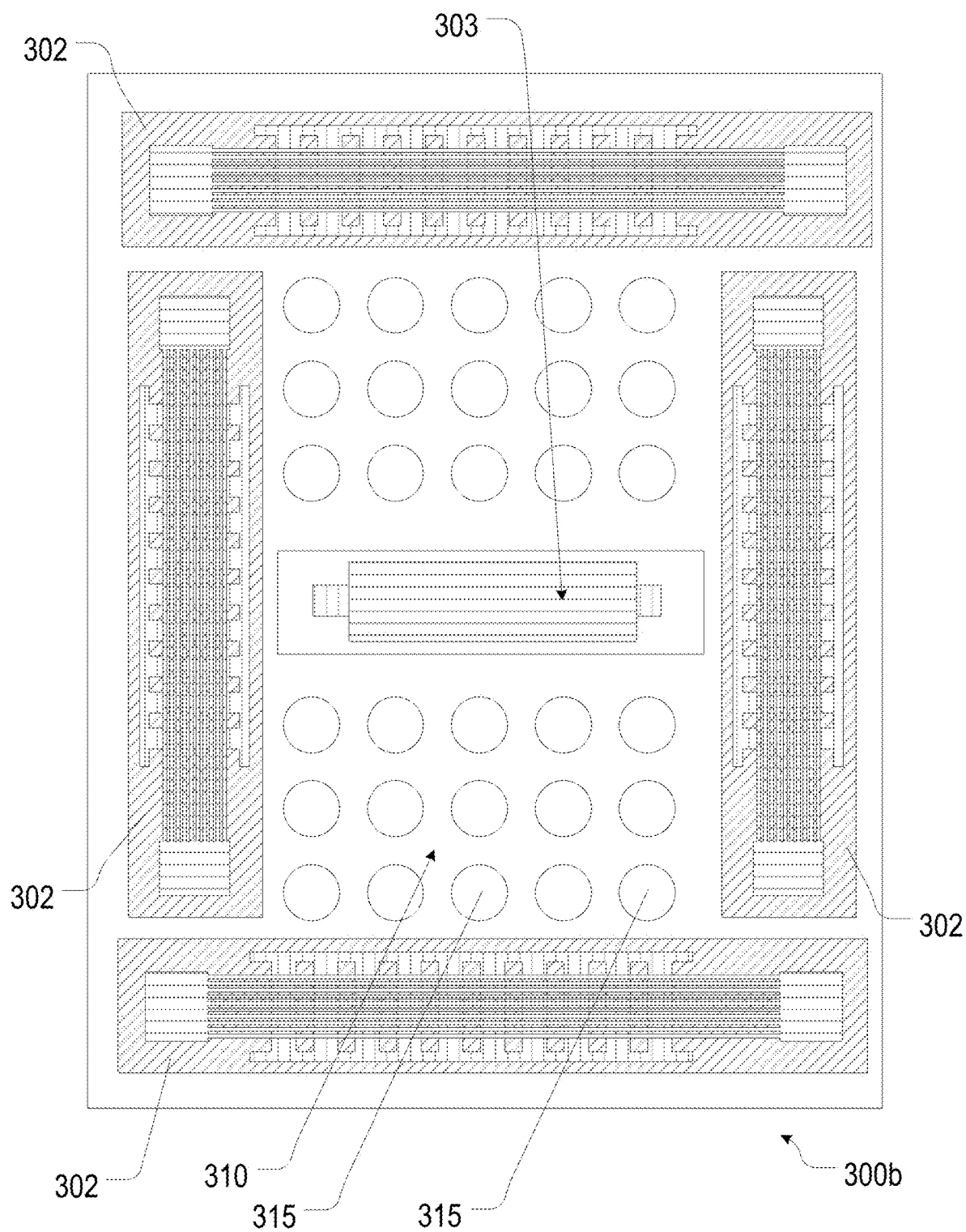
FIG. 3B illustrates another example actively cooled quantum processor, consistent with some embodiments.

FIGS. 3A and 3B illustrate an example actively cooled quantum processor 300, consistent with some embodiments. The quantum processor 300a in FIG. 3A comprises four active planar cooling structures 302, elongated and arranged around a periphery of a cooled device, such as quantum processor 310. The quantum circuit 310, in turn, comprises a plurality of quantum devices, such as qubits 315 (only some labeled for clarity). The quantum processor 300B in FIG. 3B comprises five active planar cooling structures 302, 303. Four of the active planar cooling structures 302 are elongated and arranged around a periphery of the cooled device, such as quantum processor 310, similar to FIG. 3A. The fifth active planar cooling structure 303 is placed within the periphery of the cooled device, such as between two groups of qubits 315.

In both FIGS. 3A and 3B, the active planar cooling structures 302 are formed directly on the same surface (e.g., top surface) of a substrate 360, alongside and/or in between the qubits 315 that make up the quantum circuit 310. These arrangements may be desirable because the active planar cooling structures 302 can be formed at the same time, using the same manufacturing processes, as the quantum circuit 310. This arrangement may also be desirable because the active planar cooling structures 302 are physically located in close proximity to the quantum devices.

Figure 4:
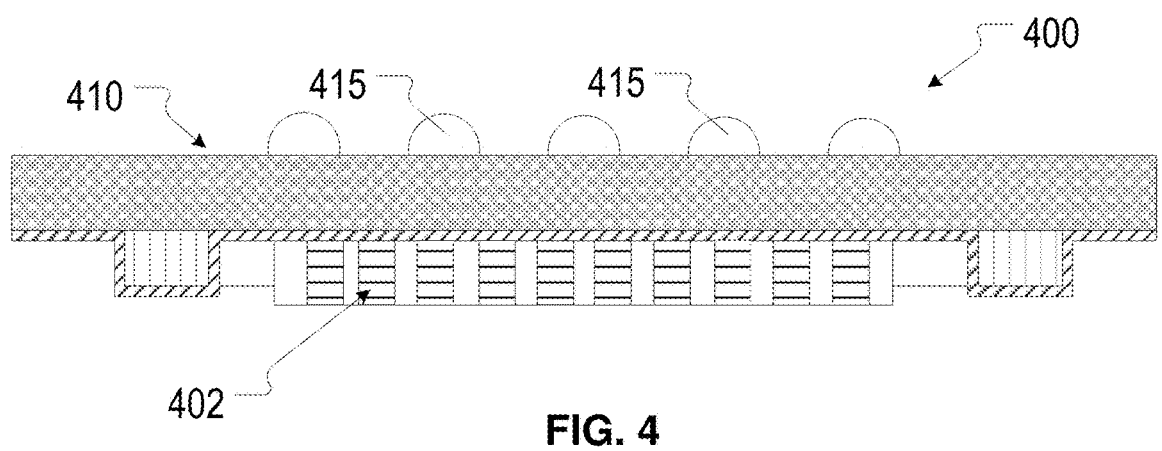
FIG. 4 illustrates another example actively cooled quantum processor, consistent with some embodiments.

FIG. 4 illustrates another example actively cooled quantum processor 400, consistent with some embodiments of the invention. The quantum processor 400 comprises a generally square shaped, active planar cooling structure 402 formed on one surface (e.g., bottom) of a substrate 460. On the opposite surface (e.g., top), a plurality of quantum devices 415 (only some labeled for clarity) have been formed, which may be combined to form a quantum circuit 410.

Figure 5:
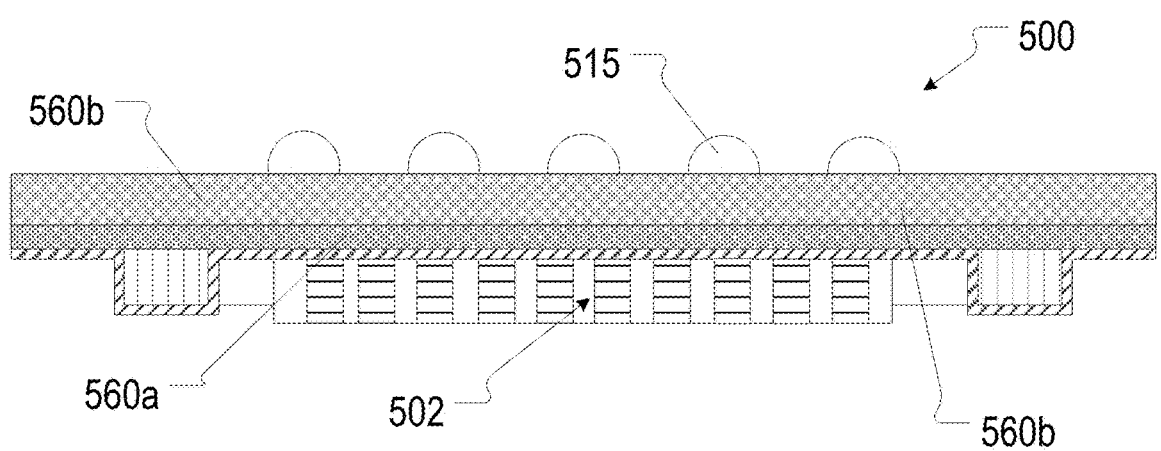
FIG. 5 illustrates another example actively cooled quantum processor, consistent with some embodiments.

FIG. 5 illustrates another example actively cooled quantum processor 500. In this example, the active planar cooling structure 502 is formed on one substrate 560a and the quantum devices 515 (only one labeled for clarity) that make up the quantum circuit 510 are formed on a second substrate 560b. The two substrates 560a and 560b are then bonded, mechanically clamped, or otherwise joined together back-to-back. These quantum processor embodiments 400 and 500 may be desirable because they can provide wider choices in materials and manufacturing processes.

Figure 6A:
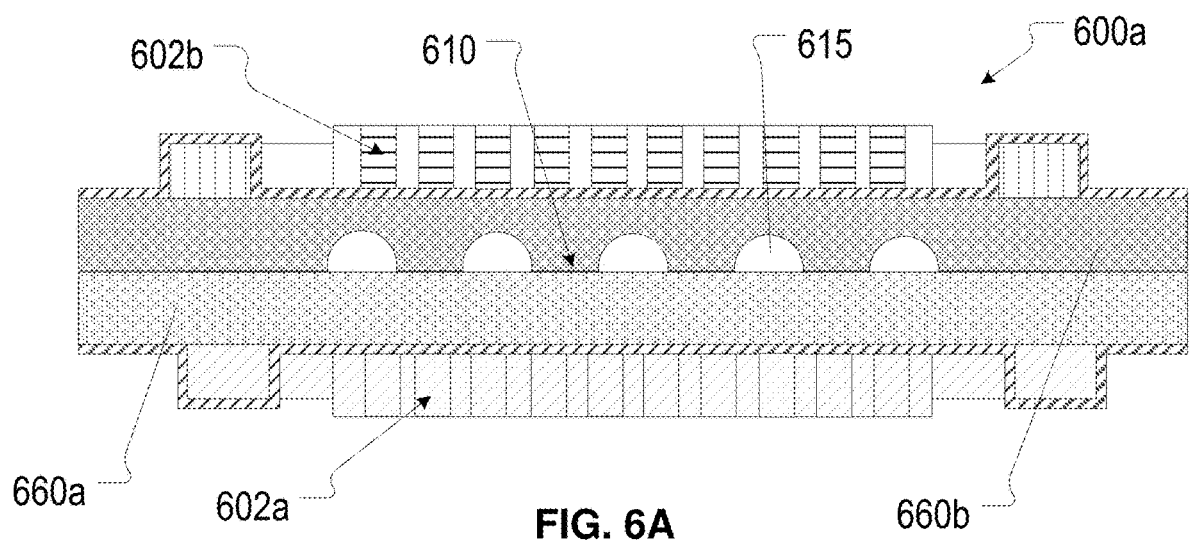
FIG. 6A illustrates another example actively cooled quantum processor, consistent with some embodiments.
Figure 6B:
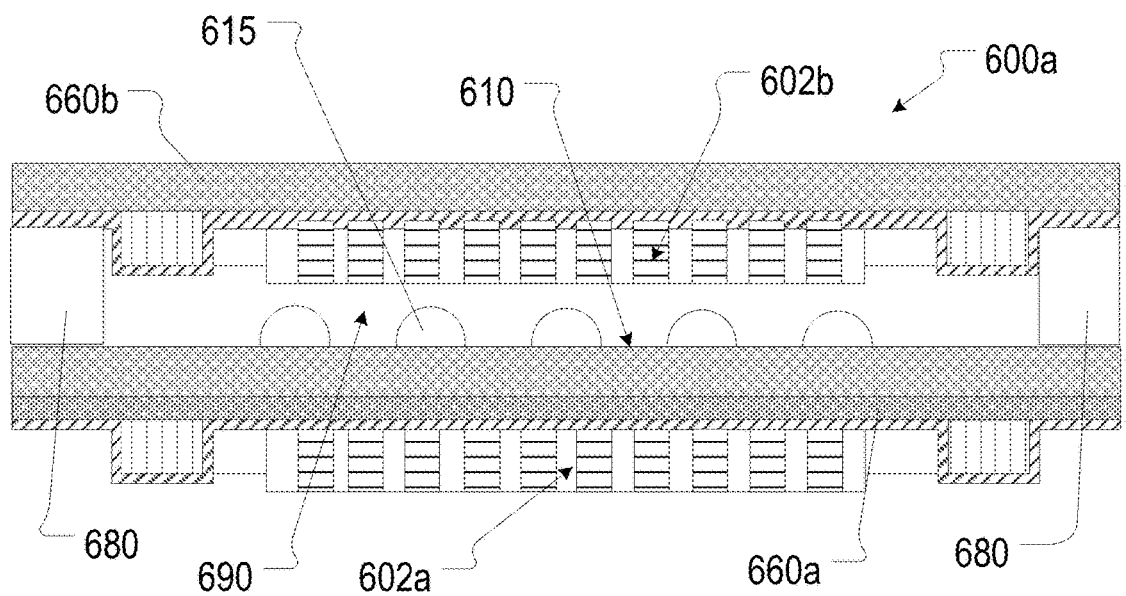
FIG. 6B illustrates another example actively cooled quantum processor, consistent with some embodiments.

FIG. 6A illustrates another example actively cooled quantum processor 600a, consistent with some embodiments of the invention. The quantum processor 600 in FIG. 6A comprises two active planar cooling structures, one 602a formed on one surface (e.g., bottom) of a first substrate 660a and one 602b formed on one surface (e.g., top) of a second substrate 660b. The two substrates 660a and 660b in this embodiment may be bonded, clamped, or otherwise joined together, such that the two substrates 660a, 660b sandwich the quantum devices 615 (only one labeled for clarity) that make up a quantum circuit 610. FIG. 6B illustrates another example actively cooled quantum processor 600b, consistent with some embodiments of the invention. In this quantum processor 600b embodiment, the top active planar cooling structure 602b is on the surface of the substrate 660b that is closest to (i.e., faces toward) the quantum devices 615 (only one labeled for clarity) that make up a quantum circuit 610.

FIG. 6B also includes a plurality of spacers 680 that prevent physical contact with the quantum devices 615 when the two substrates 660a and 660b are bonded, clamped, or otherwise joined together. The spacers 680 may optionally include channels (not shown) to allow passage of refrigerant (e.g., liquid hydrogen or helium) into and through a passageway 690 between the quantum circuit 610 and the top active planar cooling structures 602b. The embodiments in FIGS. 6A and 6B may be desirable because they can also protect the quantum devices 615 and the quantum circuit 610.

Fabrication Method

Figure 7A:
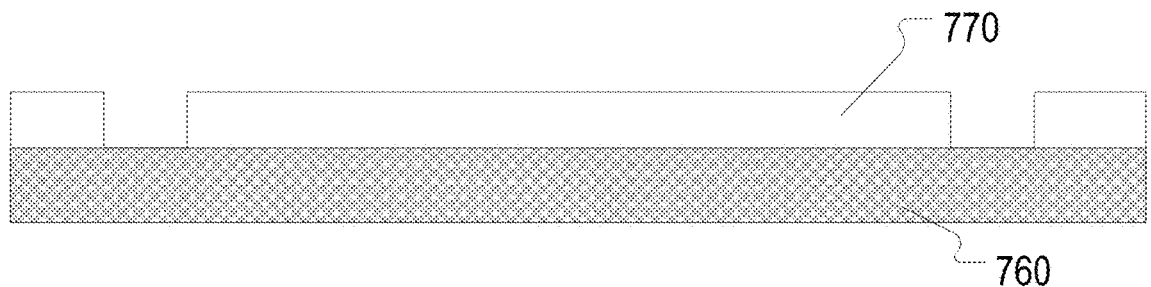
FIGS. 7A-7D are device cross sections that depict devices at various stages of an example process for fabrication of an active plan quantum cooling structure, consistent with some embodiments.
Figure 7B:
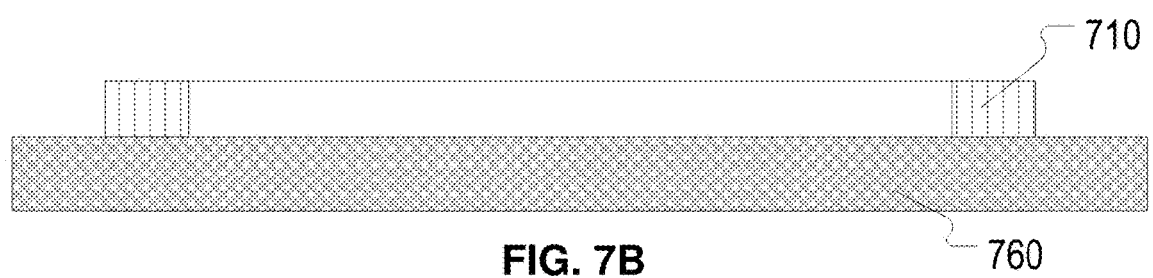

FIGS. 7A-7D are device cross sections that depict the devices at various stages of an example process for fabrication of an active plan quantum cooling structure, consistent with some embodiments. As shown in FIG. 7A, a photoresist layer 770 is first deposited on a substrate 760, and then a photoresist pattern for a first layer 710 (e.g., a normal metal layer) is then exposed onto the photoresist layer 770 using a mask and a light source (not shown). After washing away the exposed/developed photoresist, the material for the first layer of the structure (e.g., the chosen normal metal) can be applied. The remaining unexposed/undeveloped photoresist layer 770 may then be dissolved by a solvent appropriate for the chosen material and substrate. FIG. 7B illustrates the resulting structure.

Figure 7C:
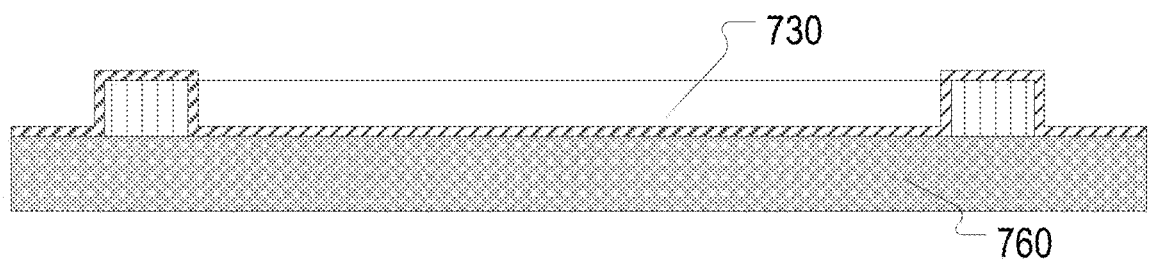
Figure 7D:
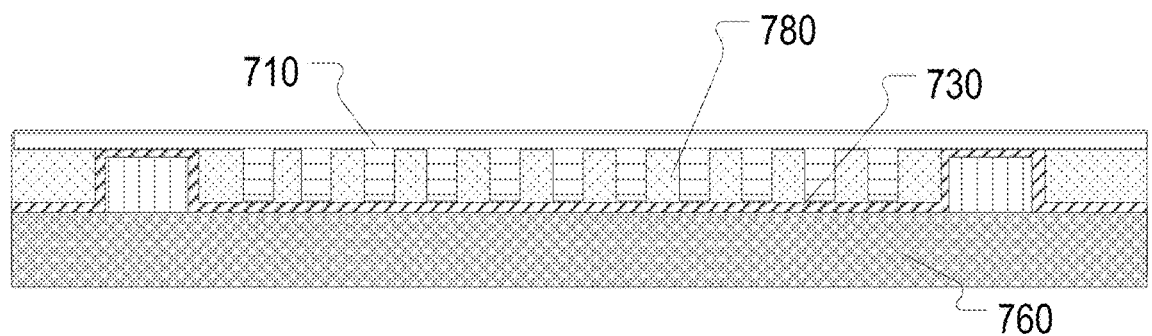

Next, an insulating layer 730 (e.g., $SiO_2$ or $HfO_2$) is deposited over the remaining (i.e., patterned) layer 710 of the structure (e.g., the normal metal layer). Suitable methods include, but are not limited to, atomic layer deposition (ALD), chemical vapor deposition (CVD), and physical vapor deposition (PVD). The resulting structure is illustrated in FIG. 7C. A pattern lift-off resist layer 780 may be applied for use in forming the next layer 720 of the structure (e.g., a superconductor layer). An inverse pattern may then be exposed onto the resist layer 780 using a mask and light source (not shown) and material for the second layer (e.g., the chosen superconductor) may be deposited. The resulting structure is shown in FIG. 7D. Next, the exposed/developed resist layer 780 is washed out, together with any material on its surface, to form the second layer (e.g., superconductor) in the desired shape. Last, electrical contacts (not shown) suitable to the normal metal and/or superconductor arrays are created and packaged in a suitable orientation for installation into a cryo-cooling structure.

Figure 8:
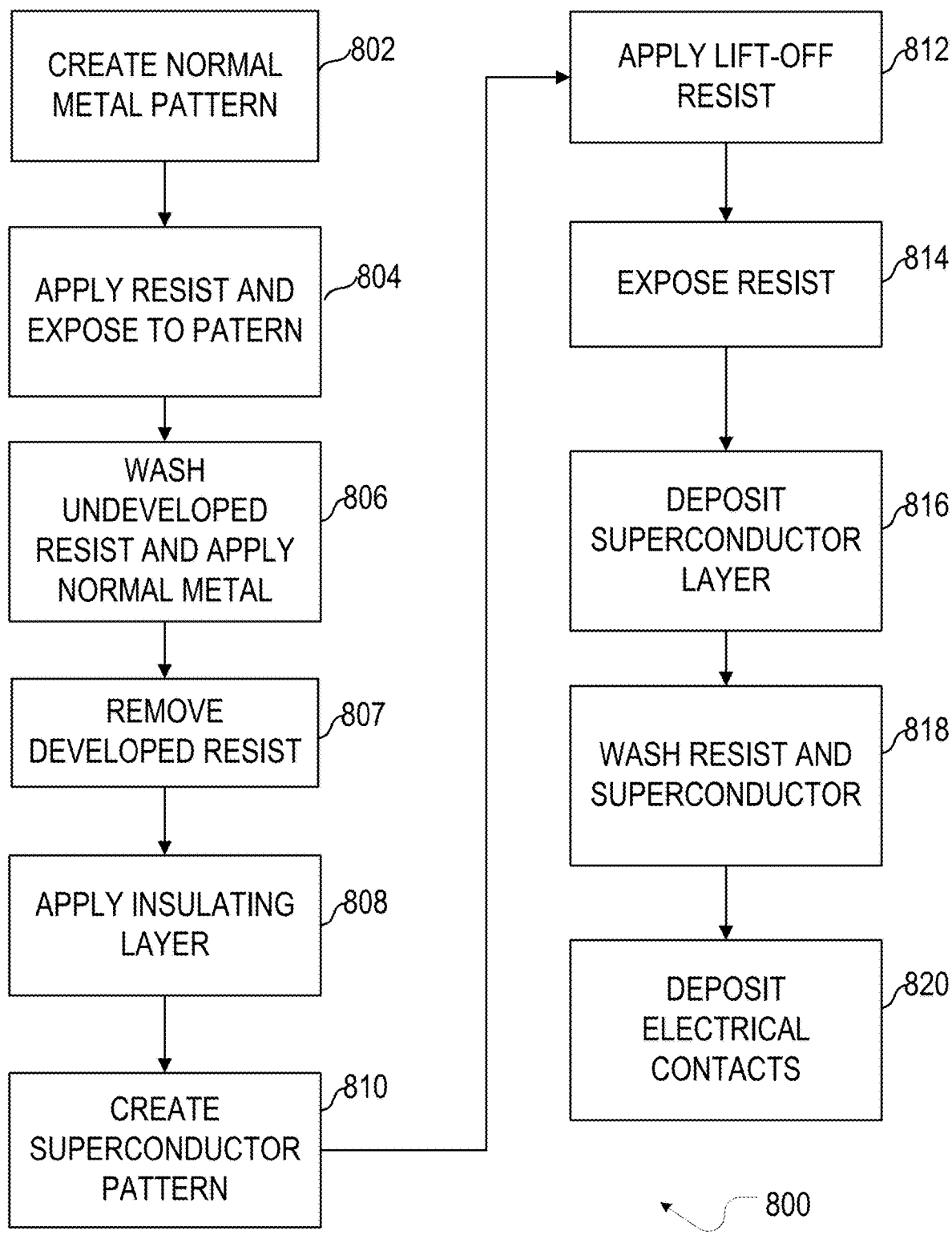
FIG. 8 depicts an example computer-implemented process for manufacturing an active plan quantum cooling structure consistent with some embodiments.

FIG. 8 depict an example computer-implemented process 800 for manufacturing an active plan quantum cooling structure consistent with some embodiments. Process 800 may, in some embodiments, be implemented in the photolithography application 105a in FIG. 1. At block 802, the photolithography application 105a creates a pattern for the first layer 710 (e.g., the normal metal layer) of a planer active cooling structure, to be deposited on the substrate 760. Next, at block 804, the photolithography application 105a causes a photoresist layer to be deposited on the substrate 760 and exposes to the first pattern to the photoresist layer. At block 806, the photolithography application 105a causes the exposed/developed photoresist to be washed out and appropriate material (e.g., the chosen normal metal) to be applied to the resulting structure. The photolithography application 105a then causes the unexposed/undeveloped photoresist, together with any adjacent normal metal, to be removed at block 807, thus forming a patterned layer 710.

At block 808, the photolithography application 105a causes an insulating layer 730 to be deposited over the patterned layer 710. At block 810, the photolithography application 105a creates a pattern for the second (e.g., superconducting) layer 720. The photolithography application 105a then directs the application of a pattern lift-off resist layer 780 (at block 812) to the current structure, which is subsequently exposed using a mask and light (at block 814). The photolithography application 105a then causes the second layer 720 (e.g., the superconductor layer) to be deposited at block 816 over the current structure. At block 818, the photolithography application 105a directs the exposed/developed resist layer 780 to be washed out, together with any superconductor on its surface, forming the patterned layer 720. Last, at block 820, the photolithography application 105a causes electrical contacts to be attached to the current structure. Then, the photolithography application 105a ends.

General

Although the present invention has been described in detail with reference to certain examples thereof, it may be also embodied in other specific forms without departing from the essential spirit or attributes thereof. For example, some embodiments are capable of being distributed as a set of instructions for a fabrication facility ("fab") encoded onto a computer readable storage media (e.g., a Release Interface Tape or "RIT," a "tape-out," a "GDS2," etc.). The computer readable storage medium, in turn, may be, for example, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

The computer readable instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Embodiments of the present invention may also be delivered as part of a service engagement with a client corporation, nonprofit organization, government entity, internal organizational structure, or the like. Aspects of these embodiments may also include analyzing specifications from the client entity, creating recommendations responsive to the analysis, generating designs for circuitry that implements some or all of recommendations, delivering fabrication instructions for the designs, and testing the resulting circuitry.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein. Therefore, it is desired that the embodiments described herein be considered in all respects as illustrative, not restrictive, and that reference be made to the appended claims for determining the scope of the invention.

What is claimed is:

1. A method for fabricating an active cooling structure, comprising:
    forming an array of Superconductor-Insulator-Normal Metal (NIS) tunnel structures between a non-superconducting layer and a superconducting layer, wherein:
    the non-superconducting layer comprises a plurality of generally parallel non-superconducting traces running in a first direction between first common pads; and
    the superconductor layer comprises a plurality of generally parallel superconducting traces running in a second direction between second common pads.

2. The fabrication method of claim 1, wherein:
    the plurality of NIS structures are formed in a grid pattern at intersections of the plurality of generally parallel non-superconducting traces and the plurality of generally parallel superconducting traces;
    the first common pads electrically connect the plurality of superconducting traces in parallel; and
    the second common pads electrically connect the non-superconducting traces in parallel.

3. The fabrication method of claim 2, further comprising:
    applying a photoresist layer to a substrate;
    exposing the photoresist layer in a pattern to create exposed photoresist and unexposed photoresist;
    removing the exposed photoresist layer;
    applying the metal layer onto the unexposed photoresist and the substrate; and
    removing the unexposed photoresist.

4. The fabrication method of claim 3, further comprising forming an insulator layer on the non-superconducting layer.

5. The fabrication method of claim 4 further comprising:
    applying a lift-off resist layer to the insulator layer;
    exposing the lift-off resist layer in a pattern to create exposed lift-off resist and unexposed lift-off resist;
    removing the exposed lift-off resist layer;
    applying the superconducting layer onto the unexposed lift-off resist layer and the insulator layer; and
    removing the unexposed lift-off resist.

6. The fabrication method of claim 5, wherein:
    the non-superconducting layer comprises silver;
    the insulator layer comprises silicon dioxide; and
    the superconductor layer comprises aluminum.

7. The fabrication method of claim 5, wherein:
    the non-superconducting layer comprises silver;
    the insulator layer comprises silicon dioxide; and
    the superconductor layer comprises niobium.

8. The fabrication method of claim 5, wherein:
    the non-superconducting layer comprises silver;
    the insulator layer comprises hafnium dioxide; and
    the superconductor layer comprises aluminum.

9. The fabrication method of claim 5, wherein:
    the non-superconducting layer comprises silver;
    the insulator layer comprises hafnium dioxide; and
    the superconductor layer comprises niobium.

10. A fabrication method for a quantum processor, comprising:
    forming a plurality of qubits formed on the first substrate; and
    forming an active cooling structure in thermal communication with the qubits, the active cooling structure comprising an array of Superconductor-Insulator-Normal Metal (NIS) tunnel structures between a non-superconducting layer and a superconducting layer, wherein:
    the non-superconducting layer comprises a plurality of generally parallel non-superconducting traces running in a first direction between first common pads;

the superconductor layer comprises a plurality of generally parallel superconducting traces running in a second direction between second common pads;
an insulator layer is formed on top of the non-superconducting layer; and
the superconductor layer is formed on top of the insulator layer.

11. The fabrication method of claim 10, further comprising:
applying a photoresist layer to a substrate;
exposing the photoresist layer in a pattern to create exposed photoresist and unexposed photoresist;
removing the exposed photoresist layer;
applying the metal layer onto the unexposed photoresist and the substrate; and
removing the unexposed photoresist.

12. The fabrication method of claim 11, further comprising forming an insulator layer on the non-superconducting layer.

13. The fabrication method of claim 12, further comprising:
applying a lift-off resist layer to the insulator layer;
exposing the lift-off resist layer in a pattern to create exposed lift-off resist and unexposed lift-off resist;
removing the exposed lift-off resist layer;
applying the superconducting layer onto the unexposed lift-off resist layer and the insulator layer; and
removing the unexposed lift-off resist.

14. The fabrication method of claim 13, wherein:
the non-superconducting layer comprises silver;
the insulator layer is chosen from the group consisting of silicon dioxide and hafnium dioxide; and
the superconductor layer is chosen from the group consisting of aluminum and niobium.

15. The fabrication method of claim 14, wherein:
the non-superconducting layer comprises silver;
the insulator layer comprises silicon dioxide; and
the superconductor layer comprises aluminum.

16. The fabrication method of claim 14, wherein:
the non-superconducting layer comprises silver;
the insulator layer comprises silicon dioxide; and
the superconductor layer comprises niobium.

17. The fabrication method of claim 14, wherein:
the non-superconducting layer comprises silver;
the insulator layer comprises hafnium dioxide; and
the superconductor layer comprises aluminum.

18. The fabrication method of claim 14, wherein:
the non-superconducting layer comprises silver;
the insulator layer comprises hafnium dioxide; and
the superconductor layer comprises niobium.

19. The fabrication method of claim 10, wherein:
the plurality of superconducting traces and the plurality of non-superconducting traces intersect at a plurality of locations in the X-Y plane; and
the plurality of NIS structures are formed in a grid pattern at the intersections.

20. A semiconductor fabrication system for fabricating a thermalization structure, the semiconductor fabrication system comprising:
a computer readable storage media having a set of instructions for a fabrication facility encoded thereon which, when operated by a processor causes a fabrication method to be performed, the fabrication method comprising:
forming an array of Superconductor-Insulator-Normal Metal (NIS) tunnel structures between a non-conducting layer and a superconducting layer, wherein:
the non-superconducting layer comprises a plurality of generally parallel non-superconducting traces running in a first direction between first common pads; and
the superconductor layer comprises a plurality of generally parallel superconducting traces running in a second direction between second common pads.

* * * * *